(12) United States Patent
Potanin et al.

(10) Patent No.: US 7,019,581 B1
(45) Date of Patent: Mar. 28, 2006

(54) CURRENT SENSE CIRCUIT

(75) Inventors: Vladislav Potanin, San Jose, CA (US);
Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 134 days.

(21) Appl. No.: 10/859,627

(22) Filed: Jun. 3, 2004

(51) Int. Cl.
*H03K 17/687* (2006.01)

(52) U.S. Cl. .......................... 327/427; 327/543; 327/51

(58) Field of Classification Search .................. 327/50, 327/51, 427; 323/315
See application file for complete search history.

(56) References Cited

U.S. PATENT DOCUMENTS

| | | | | |
|---|---|---|---|---|
| 5,867,014 | A | 2/1999 | Wrathall et al. | 327/543 |
| 5,903,422 | A * | 5/1999 | Hosokawa | 327/427 |
| 6,559,684 | B1 | 5/2003 | Goodfellow et al. | 323/316 |
| 6,600,362 | B1 * | 7/2003 | Gavrila | 327/541 |
| 6,700,365 | B1 * | 3/2004 | Isham et al. | 323/317 |

OTHER PUBLICATIONS

Linear Technology (LTC4054L-4.2) Manual, "150Ma Standalone Linear Li-Ion Battery Charger in ThinSOT." 16pp. Available: www.linear.com.
Lee, Cheung Fai and Philip K.T. Mok. 2002. On-chip Current Sensing Technique for CMOS Monolithic Switchmode Power Converters. *IEEE*. 0-7803-7448-7/2/.

* cited by examiner

*Primary Examiner*—Long Nguyen
(74) *Attorney, Agent, or Firm*—Darby & Darby PC; John W. Branch

(57) ABSTRACT

A method and circuit for tracking a load current and a load voltage to provide an output signal that is proportional to the load current. The circuit enables employment of high gate area (W/L) ratio for a current mirror type current sense circuit, while maintaining accuracy of a sense current. A tracking circuit tracks the load current and the load voltage providing equal biasing to a power pass transistor and a power sense transistor. The tracking circuit further supplies a gate voltage to a cascode transistor, which provides the output signal proportional to the load current. A trimming circuit allows adjustment of a current flowing through the cascode transistor enabling calibration of the circuit for variations of W/L ratio between the power pass transistor and power sense transistor due to manufacturing tolerances. Calibration may be performed during initial power-on and selected trimming transistors may be turned on or off.

19 Claims, 2 Drawing Sheets

CURRENT SENSE CIRCUIT

FIELD OF THE INVENTION

The present invention relates to current sensing, and, in particular, to a current sense circuit that provides an output signal that is proportional to a sensed load current.

BACKGROUND

Current sense circuits fulfill a number of functions in electronic devices. By sensing an output current and providing a signal proportional to the sensed output current, a current sense circuit may be an integral part of a fault protection circuit, a current control circuit, a power supply device, and the like.

It is desirable in modern power supply devices such as voltage regulators, battery chargers, and the like, to have accurate current sensing for current regulation, over-current protection, and the like. For accurate current sensing variations due to component characteristics, manufacturing methods, and the like, may have to be restricted. It is further desirable to maintain simplicity of the circuit for cost and efficiency considerations.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is related to a current sense circuit that tracks a load current and provides an output signal that is proportional to the load current, while providing a sense current that is low relative to the load current. For increased efficiency purposes, it is desirable in current sense circuits to select as high a ratio between the load current and the sense current as possible. The ratio between the load current and the sense current in a basic sense circuit comprising a current mirror depends, in part, on ratio of a gate area of a power pass transistor and a sense transistor. This ratio is commonly termed as width/length (W/L) ratio. However, when a high W/L ratio is selected, an accuracy of the sense current decreases due to manufacturing tolerances, and the like. The present invention provides a circuit and method that enables the selection of a load current to sense current ratio for power pass and sense transistors of a current sense circuit, while preserving desired amount of accuracy.

By employing a tracking circuit to track the load voltage and provide a tracking voltage that is substantially the same as the load voltage to the sense transistor, the present invention enables a relatively accurate sensing of the load current. Furthermore, the present invention allows adjustment of accuracy during initial calibration of the circuit and design of desired granularity by a selection of a number and W/L ratio of trim circuit transistors. Accordingly, the invention allows virtual adjustment of the W/L ratio of the power pass and sense transistors of a current sense circuit.

The current sense circuit described herein may be employed in virtually any regulation circuit known to those skilled in the art. Such circuits may include voltage regulators, current regulators, and the like.

Figure 1:
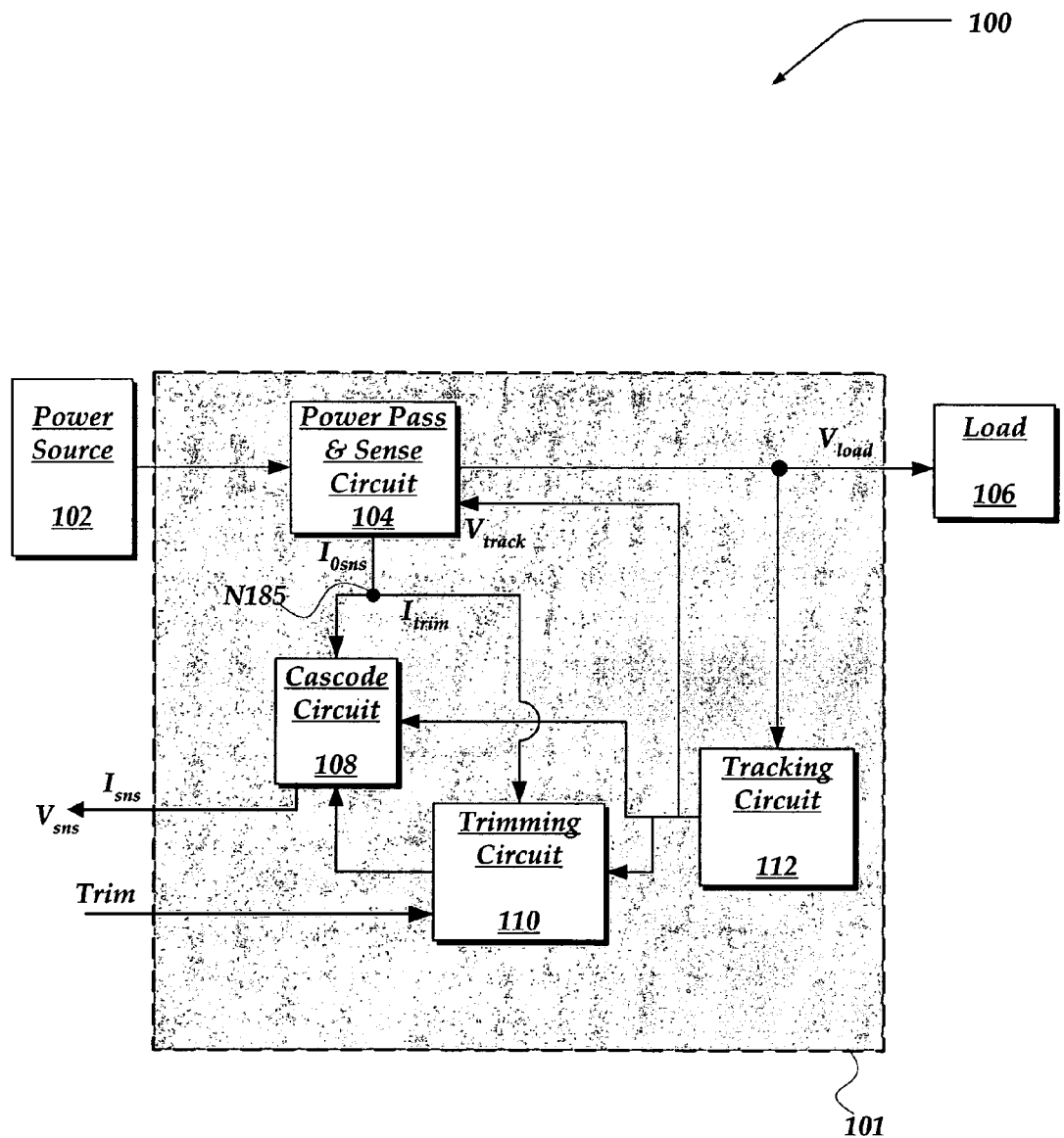
FIG. 1 illustrates a block diagram of an embodiment of a current sense device according to the present invention.

FIG. 1 illustrates block diagram 100 of an embodiment of a current sense device according to one embodiment of the present invention with external devices employing the circuit. External devices include power source 102 and load 106. Block diagram 100 of current sense device 101 includes several blocks including power pass and sense circuit 104, cascode circuit 108, trimming circuit 110, and tracking circuit 112.

Power pass and sense circuit 104 may perform a function of receiving an input voltage from an external power source such as power source 102 and providing a regulated voltage and/or current to load 106. Power pass and sense circuit 104 may also provide a sensed current $I_{0sense}$ to node N185. In one embodiment power source 102, load 106, or both may be implemented on a chip with current sense device 101.

Cascode 108 may receive a portion $I_{0sense}$ from power pass and sense circuit 104. Cascode 108 is also arranged to provide a current sense signal that is substantially proportional to a load current. The current sense signal may comprise current sense current $I_{sns}$ or current sense voltage $V_{sns}$. A value of the current sense signal may be determined based, in part, on a configuration of power pass and sense circuit 104, trimming circuit 210, and tracking circuit 212.

Tracking circuit 112 may sense a load voltage $V_{load}$ and provide tracking voltage $V_{track}$ to trimming circuit 110 and cascode circuit 108 and power pass and sense circuit 104 such that $V_{track}$ is substantially equal to $V_{load}$. Accordingly, transistors in power pass and sense circuit 104 may have substantially equal biasing voltages as described in more detail in conjunction with FIG. 2.

Trimming circuit 110 may receive an trim input signal (Trim) and determine an amount of the trimming current that is to be diverted from cascode circuit 108 such that the current sense signal tracks the load current substantially. In one embodiment, trimming circuit 110 may include a predetermined number of trim transistors that are in a current mirror relationship with a transistor of cascode circuit 108.

Tracking circuit 112 may provide an accurate tracking of the load voltage, while trimming circuit 110 may provide a virtual adjustment of a load current to sensed current ratio, allowing cascode circuit 108 to provide the current sense signal that is accurately proportional to the load current according to a predetermined ratio. This characteristic of the circuit reduces an inaccuracy of the sensed current while enabling employment of a high load current to sensed current ratio. As described below, trimming circuit 110 may be embodied by a series of transistors, a number of which may be turned on or off during a calibration process based on an actual ratio of load current to sensed current.

Figure 2:
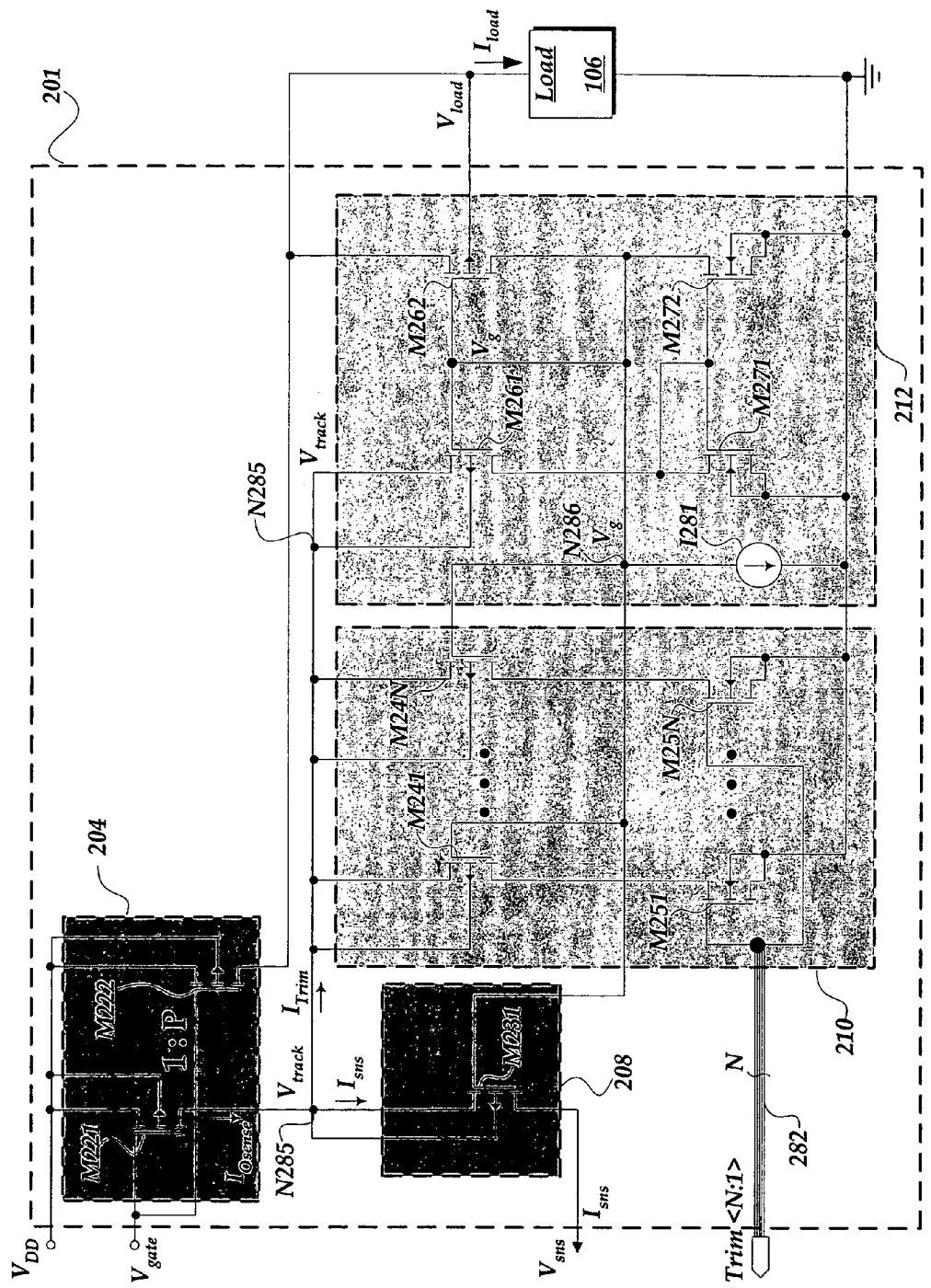
FIG. 2 schematically illustrates an embodiment of the current sense circuit of FIG. 1.

FIG. 2 schematically illustrates an embodiment of current sense device 201 along with an external load. Current sense device 201 may be an exemplary embodiment of current sense device 101 of FIG. 1. Current sense device 201 includes power pass and sense circuit 204, cascode circuit 208, trimming circuit 210, and tracking circuit 212. External load 106 is also shown. FIG. 2 shows a particular arrangement of inputs and outputs of the various components. In one embodiment, all of the components of current sense device 201 may be included in the same chip. Alternatively, one or more of the components of current sense device 201 may be off-chip. Other embodiments of current sense device 201 may include additional or fewer components.

Power pass and sense circuit 204 includes sense transistor M221 and power transistor M222 with a predetermined gate area ratio of 1:P. Power transistor M222 provides a load current to external load 106. Sense transistor M221 and power transistor M222 are arranged as a current mirror, where the sense transistor senses 1/Pth portion of a current flowing through power transistor M222. For relatively large gate area ratios, sensed current inaccuracies up to about 15% are not atypical. Inaccuracies may occur, among other things, due to manufacturing tolerances resulting in chip-to-chip variations. At the same time, larger gate area ratios are desirable, because they increase efficiency of the circuit by consuming a smaller portion of a supply current for sensing. In one embodiment, the gate area ratio between power transistor M222 and sense transistor M231 may range between about 100 and about 1000.

Cascode circuit 208 comprises, in one embodiment, transistor M231. A source of transistor M231 is arranged to receive a portion of the sensed current from sense transistor M221 at node N285. Node N285 is also coupled to trimming circuit 210, which is arranged to draw another portion of the sensed current $I_{0sense}$ based on a trimming current. Tracking voltage $V_{track}$, which, in operation, is provided by tracking circuit 212 at node N285, is substantially equal to load voltage $V_{load}$. Accordingly, a substantially equal biasing is provided to power pass transistor M222 and sense transistor M221 of the power pass and sense circuit. A drain of transistor M231 is arranged to provide the current sense signal to be utilized by other circuitry such as a current regulation circuit and the like. As previously described, the current sense signal may be current sense current $I_{sns}$ or current sense voltage $V_{sns}$. Tracking circuit 212 is arranged to provide a gate voltage of transistor M231.

Tracking circuit 212 is arranged to receive a portion of load current $I_{load}$ and to track load voltage $V_{load}$. By providing tracking voltage $V_{track}$, which is substantially equal to load voltage $V_{load}$, to sense transistor M221, tracking circuit 212 enables substantially equal biasing for the current mirror of power pass and sense circuit 204, allowing relatively accurate current sensing. However, gate area irregularities, and the like may result in the load current to sensed current ratio still being different from 1:P. Trimming circuit 210 is employed to compensate for that inaccuracy as described in detail below.

Tracking circuit 212 may include transistors M261, M262, M271, and M272. Transistor M262 is arranged to operate as a diode and provide gate voltage $V_g$ to gates of trim transistors in trimming circuit 210 as well as transistor M231 of cascode circuit 208 at node N286. Since transistor M262 operates as a diode, gate voltage $V_g$ is less than load voltage $V_{load}$ by about the gate-source voltage of M262. Transistor M261 is arranged to operate as a current mirror with transistor M231 and trim transistors of trimming circuit 210. A source of transistor M261 provides $V_{track}$ to those transistors at node N285 as described above. Finally, transistors M271 and M272 are arranged to operate as a current mirror coupled to a drain of M261 and M262 such that a current flowing through transistor M262 is be substantially equal to a current flowing through transistor M261, enabling $V_{track}$ to be substantially the same as $V_{load}$. Tracking circuit 212 further includes current source 1281 to provide an initial current for operation of transistors until sensed current is available to M261 and to the trim transistors.

Trimming circuit 210 is arranged to modify a portion of the sensed current $I_{0sense}$ flowing from sense transistor M221 to transistor M231 of cacode circuit 208 such that $I_{sns}$ or $V_{sns}$, may be calibrated for manufacturing variations and the like that result in the load current to sensed current ratio not being about equal to 1:P. Trimming circuit 210 includes a predetermined number of trim transistors M241 through M24N. Trim transistors M241 through M24N are arranged to be in a current mirror relationship with transistor M231. Sources and body terminals of trim transistors M241 through M24N are arranged to receive tracking voltage $V_{track}$ at node N285. Drains of the trim transistors are coupled switch transistors M251 through M25N, which are arranged to receive an trim input signal and to turn on selected trim transistors during a calibration.

The calibration may be performed during initial power up of the current sense device manually, by employing a calibration software, and the like. A predetermined signal may be provided to the device wherein the device is terminated with a known load. $I_{sns}$ may be measured and its value compared to a desired value. If the measured current sense current is different from the $I_{sns}$ selected trim transistors may be turned on employing Trim input. A digital signal provided to Trim input may turn on selected switch transistors M251 through M25N. Conducting switch transistors, in return, turn on selected trim transistors allowing additional current to flow through those. This will enable a larger portion of the sensed current from sense transistor M221 to be drawn by trimming circuit 210 reducing the measured $I_{sns}$ until the desired value is obtained. The amount of the trimming current may be determined by the number of turned-on trim transistors and by the amount of current drawn by each turned-on trim transistor.

In one embodiment, a ratio of gate areas of trim transistors M241 through M24N may be selected according to a binary scheme, a linear scheme, a logarithmic scheme, and the like. The selection of the ratio of the gate areas and the number of available trim transistors may be determined based, in part, on a desired accuracy for $I_{sns}$ Upon completion of the calibration, the selected trim transistors may remain turned on for normal operation of current sense device 201 employing breaking a selected fuse, burning a p-n gate, removing an etched resistor, and the like. If a binary ratio scheme is employed, the trim input signal for turning selected trim transistors on, may be a digital signal. With the above described arrangement trimming circuit 210 may enable a virtual adjustment of gate area ratio between power transistor M222 and sense transistor for implementing the invention can be one of BJTs, PMOS FETs, and NMOS FETs.

The above specification, examples and data provide a description of the manufacture and use of the composition of the invention. Since many embodiments of the invention can be made without departing from the spirit and scope of the invention, the invention also resides in the claims hereinafter appended.

We claim:

1. A device for current sensing, comprising:
    a power pass and sense circuit that is arranged to provide a regulated load current and a load voltage to a load in response to an input voltage and an external control signal, and to provide a sensed current;
    a tracking circuit that is arranged to track the load voltage and to provide a tracking voltage in response to the load voltage;
    a trimming circuit that is arranged to provide a trimming current in response to the tracking voltage and a trim input signal such that a portion of the sensed current is diverted to the trimming circuit; and
    a cascode circuit that is arranged to provide a current sense signal in response to the sensed current, the tracking voltage, and the trimming current such that the current sense signal is substantially proportional to the load current.

2. The device of claim 1, wherein the power pass and sense circuit includes a power pass transistor and a power sense transistor, wherein the power pass transistor and the power sense transistor are arranged to operate as a current mirror.

3. The device of claim 2, wherein the power pass transistor and the power sense transistor have a gate area ratio ranging from about 100 to about 1000.

4. The device of claim 2, wherein the power sense transistor is arranged to provide the sensed current to the cascode circuit.

5. The device of claim 1, wherein the trimming circuit comprises a predetermined number of transistors that are turned on by the trim input signal such that the predetermined number of transistors determine a portion of the sensed current to be diverted from the cascode circuit.

6. The device of claim 5, wherein the predetermined number of transistors are arranged in a current mirror relationship with a transistor in the cascode circuit.

7. The device of claim 1, wherein the tracking circuit is further arranged to:
    receive a portion of the load current and sense a load voltage; and
    provide a gate voltage to the trimming circuit and the cascode circuit.

8. The device of claim 1, wherein the tracking circuit is further arranged to maintain the tracking voltage substantially equal to the load voltage such that a power pass transistor and a power sense transistor of the power pass and sense circuit are provide with a substantially equal biasing.

9. A circuit for current sensing, comprising:
    a power pass and sense circuit that is arranged to provide a regulated load current and a load voltage to a load in response to an input voltage and an external control signal, and further arranged to provide a sensed current;
    a plurality of trim transistors that are arranged to operate as a current mirror with another transistor such that the plurality of trim transistors determine a trimming current to be diverted from the sensed current; and
    a plurality of switch transistors that are arranged to turn on the plurality of trim transistors in response to a trim input signal.

10. The circuit of claim 9, wherein the trimming circuit is further arranged such that a value of the trimming current is determined by:
    a number of the plurality of trim transistors that are turned on; and
    a gate area of each of the plurality of trim transistors that is turned on.

11. The circuit of claim 10, wherein the gate area of each of the plurality of trim transistors is preselected according to at least one of a linear weighting scheme, a binary weighting scheme, and a logarithmic weighting scheme.

12. The circuit of claim 9, wherein the trimming circuit is further arranged such that the selected trim transistors are turned on in a calibration process during an initial power-on.

13. The circuit of claim 12, wherein the trimming circuit is further arranged such that a value of the trimming current that is determined during the calibration process is maintained substantially same throughout an operation of the circuit by employing at least one of breaking a selected fuse, burning a p-n gate, and removing an etched resistor.

14. The circuit of claim 9, wherein a number of the plurality of trim transistors and a number of the plurality of switch transistors are substantially equal.

15. The circuit of claim 9, wherein the plurality of trim transistors determine the trimming current such that a current through the another transistor is substantially proportional to the load current.

16. A device for current sensing, comprising:
    a power pass and sense circuit that is arranged to provide a regulated load voltage to a load in response to an input voltage and a control signal, and further arranged to provide a sensed current to a node; and
    a tracking circuit, comprising:
        a first transistor that is arranged to be in a current mirror configuration with another transistor;
        a second transistor that is arranged to operate as a diode and sense the regulated load voltage and
        a current mirror circuit is arranged to draw current from the first and the second transistors such that a tracking voltage at the node is substantially equal to the regulated load voltage.

17. The device of claim 16, wherein the tracking circuit is arranged, by using substantially equal biasing to a power pass transistor and a current sense transistor of the power pass and sense circuit, such that the sensed current is substantially proportional to a load current to the load.

18. The device of claim 16, wherein the tracking circuit further comprises a current source that is arranged to provide an initial current through the first transistor and the current mirror circuit.

19. The device of claim 16, wherein the first and secong transistors include at least one of a BJT, a PMOS FET, and an NMOS FET.

* * * * *

UNITED STATES PATENT AND TRADEMARK OFFICE
CERTIFICATE OF CORRECTION

| | | |
|---|---|---|
| PATENT NO. | : 7,019,581 B1 | Page 1 of 1 |
| APPLICATION NO. | : 10/859627 | |
| DATED | : March 28, 2006 | |
| INVENTOR(S) | : Vladislav Potanin et al. | |

It is certified that error appears in the above-identified patent and that said Letters Patent is hereby corrected as shown below:

In the Claims:

Column 5, Line 37, In Claim 5, delete "a portion" and insert -- the portion --.

Column 6, Line 57, In Claim 19, delete "secong" and insert -- second --.

Signed and Sealed this

Eighth Day of August, 2006

JON W. DUDAS
*Director of the United States Patent and Trademark Office*